(12) United States Patent
Sasaki

(10) Patent No.: US 7,253,553 B2
(45) Date of Patent: Aug. 7, 2007

(54) ELECTRONIC COMPONENT

(75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 221 days.

(21) Appl. No.: 11/014,966

(22) Filed: Dec. 20, 2004

(65) Prior Publication Data
US 2005/0156489 A1    Jul. 21, 2005

(30) Foreign Application Priority Data
Dec. 24, 2003    (JP)    ............... P2003-427764

(51) Int. Cl.
H01L 41/047    (2006.01)
H01L 41/083    (2006.01)
(52) U.S. Cl. .................. 310/365; 310/364; 310/366
(58) Field of Classification Search ........ 310/311–371, 310/800
See application file for complete search history.

(56) References Cited

U.S. PATENT DOCUMENTS

| | | | | |
|---|---|---|---|---|
| 1,785,036 | A * | 12/1930 | Marrison | 310/346 |
| 4,584,499 | A * | 4/1986 | Leskovec et al. | 310/318 |
| 6,093,997 | A * | 7/2000 | Zimnicki et al. | 310/352 |
| 6,998,764 | B2 * | 2/2006 | Sasaki et al. | 310/365 |
| 7,042,142 | B2 * | 5/2006 | Sasaki et al. | 310/365 |
| 7,071,600 | B2 * | 7/2006 | Sasaki | 310/366 |
| 7,102,275 | B2 * | 9/2006 | Sasaki | 310/366 |
| 7,157,837 | B2 * | 1/2007 | Kojima | 310/365 |
| 2001/0002727 | A1 * | 6/2001 | Shiraishi et al. | 257/685 |
| 2003/0000067 | A1 * | 1/2003 | Hori | 29/592.1 |
| 2004/0135467 | A1 * | 7/2004 | Chiba et al. | 310/310 |
| 2005/0140251 | A1 * | 6/2005 | Sasaki | 310/366 |

FOREIGN PATENT DOCUMENTS

| | | | | |
|---|---|---|---|---|
| JP | 5-19274 | * | 11/1991 | ........ 349/143 |
| JP | A 2001-260349 | | 9/2001 | |
| JP | A 2002-019102 | | 1/2002 | |
| JP | A 2002-254634 | | 9/2002 | |

* cited by examiner

Primary Examiner—Thomas M. Dougherty
(74) Attorney, Agent, or Firm—Oliff & Berridge, PLC

(57) ABSTRACT

Provided is an electronic component permitting lead wires or the like to be securely soldered to a plurality of respective terminal electrodes connected to electroconductive members in through holes. On a surface 7a of a stack-type piezoelectric device being an electronic component, a lead wire is soldered to a second electrode layer 23 on one end side in the longitudinal direction of one terminal electrode 17 out of two adjacent terminal electrodes, and a lead wire is soldered to a second electrode layer 23 on the other end side in the longitudinal direction of the other terminal electrode 17. Since the one end side of one terminal electrode 17 and the other end side of the other terminal electrode 17 are located on the side opposite to the side where each terminal electrode is connected to an electroconductive member 14 in a through hole 13, it is feasible to prevent the electroconductive member 14 in the through hole 13 from dissolving into a molten solder 25. In addition, solders 25 are prevented from adjoining in the direction perpendicular to the longitudinal direction of the terminal electrodes 17, and it is thus feasible to prevent solders 25 from joining together between adjacent terminal electrodes 17, 17.

4 Claims, 15 Drawing Sheets

ELECTRONIC COMPONENT

BACKGROUND OF THE INVENTION

1. Field of the Invention

The present invention relates to an electronic component using through holes for electrical connection.

2. Related Background Art

An example of the conventional electronic components of this type is a stack-type piezoelectric device, for example, as described in Japanese Patent Application Laid-Open No. 2002-254634. This stack-type piezoelectric device consists of an alternate stack of piezoelectric layers in each of which a number of individual electrodes are formed in a pattern, and piezoelectric layers in each of which a common electrode is formed in a pattern, and the individual electrodes aligned in the thickness direction of the stack-type piezoelectric device are connected by electroconductive members through through holes formed in the piezoelectric layers.

In this stack-type piezoelectric device, lead wires for connection to a drive power supply are soldered to respective terminal electrodes formed on the uppermost piezoelectric layer. When a voltage is applied between predetermined individual electrodes and common electrodes through the lead wires, active parts (portions to be distorted by piezoelectric effect) corresponding to the predetermined individual electrodes in the piezoelectric layers are selectively displaced.

SUMMARY OF THE INVENTION

In the stack-type piezoelectric device as described above, however, the electroconductive member in the through hole formed under each terminal electrode can dissolve into a molten solder (so called solder leaching) during the soldering of the lead wire to the terminal electrode, so as to cause breakage of electrical connection in the through hole. In addition, solders for soldering of lead wires can join together because of overflow or the like between adjacent terminal electrodes to cause a short circuit between the adjacent terminal electrodes.

The present invention has been accomplished in view of such circumstances and an object of the present invention is therefore to provide an electronic component permitting lead wires or the like to be securely soldered to respective terminal electrodes connected to electroconductive members in through holes.

In order to achieve the above object, an electronic component according to the present invention is an electronic component in which each of a plurality of terminal electrodes arranged along a predetermined direction on a surface of a substrate is connected to an electroconductive member in a through hole formed in the substrate, wherein one of two terminal electrodes adjacent to each other is connected to the electroconductive member in the through hole on one end side in a direction perpendicular to the predetermined direction and wherein the other terminal electrode is connected to the electroconductive member in the through hole on the other end side in the direction perpendicular to the predetermined direction.

In this electronic component, for one terminal electrode out of two adjacent terminal electrodes, a lead wire or the like is soldered to the one end side in the direction perpendicular to the predetermined direction; for the other terminal electrode, a lead wire or the like is soldered to the other end side in the direction perpendicular to the predetermined direction. Since the one end side of one terminal electrode and the other end side of the other terminal electrode are located on a side opposite to a side where each terminal electrode is connected to the electroconductive member in the through hole, it becomes feasible to prevent the electroconductive member in each through hole from dissolving into a molten solder. In addition, the soldering of lead wires or the like as described above can prevent solders for soldering of lead wires or the like from adjoining in the predetermined direction, and it thus becomes feasible to prevent solders from joining together between adjacent terminal electrodes. Therefore, this electronic component permits lead wires or the like to be securely soldered to the respective terminal electrodes connected to the electroconductive members in the through holes.

Preferably, the terminal electrodes are formed in a shape whose longitudinal direction is the direction perpendicular to the predetermined direction. This secures a long distance between a portion connected to the electroconductive member in the through hole and a portion soldered to a lead wire or the like in each terminal electrode, whereby it becomes feasible to more securely prevent the electroconductive member in each through hole from dissolving into a molten solder during soldering of the lead wire or the like to the terminal electrode. Furthermore, even if adjacent terminal electrodes are formed with a narrower space in this case, the long distance can be secured between portions where lead wires or the like are soldered in the respective adjacent terminal electrodes, and it thus becomes feasible to more securely prevent solders from joining together between the adjacent terminal electrodes.

Preferably, each terminal electrode comprises a first electrode layer formed on the surface of the substrate, and a second electrode layer formed on a surface of the first electrode layer, and the second electrode layer is formed on a side opposite to a side where the first electrode layer is connected to the electroconductive member in the through hole. In this case, the second electrode layer can be made of a material on which a solder can be readily loaded (i.e., a material with good solderability), whereby lead wires or the like can be securely soldered to the side opposite to the side where each terminal electrode is connected to the electroconductive member in the through hole.

Preferably, a lead wire is connected to each terminal electrode by a solder. In this electronic component, as described above, the electroconductive member in the through hole is prevented from dissolving into the molten solder, and solders are prevented from joining together between adjacent terminal electrodes. Therefore, the lead wires or the like are securely soldered to the respective terminal electrodes connected to the electroconductive members in the through holes.

DESCRIPTION OF THE PREFERRED EMBODIMENTS

Stack-type piezoelectric devices as preferred embodiments of the electronic component according to the present invention will be described below in detail with reference to the drawings. Identical or equivalent portions will be denoted by the same reference symbols throughout the description of the drawings, without redundant description.

First Embodiment

Figure 1:
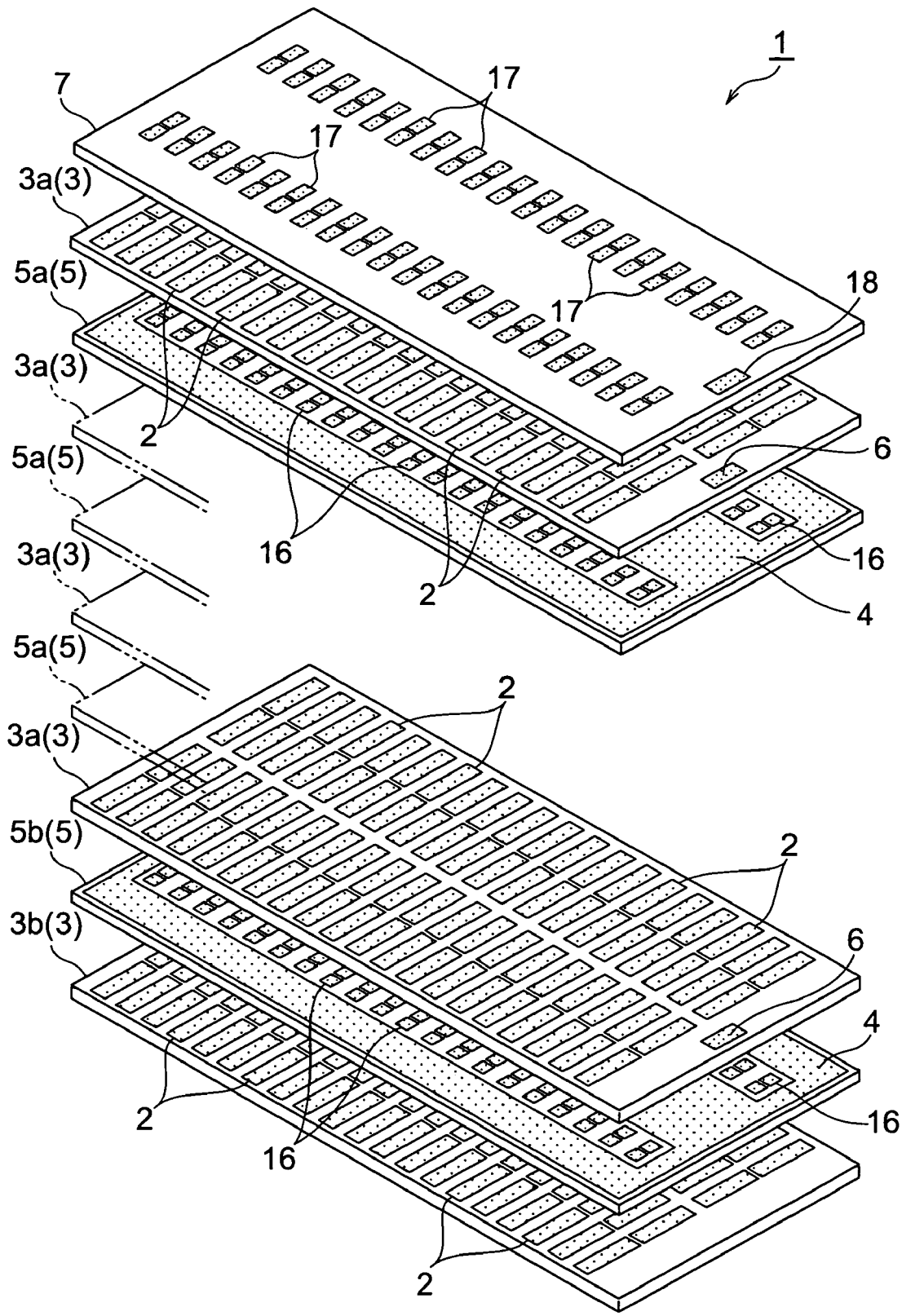
FIG. 1 is an exploded perspective view showing a stack-type piezoelectric device of a first embodiment.

As shown in FIG. 1, the stack-type piezoelectric device 1 of the first embodiment consists of an alternate stack of piezoelectric layers 3 in each of which individual electrodes 2 are formed, and piezoelectric layers 5 in each of which a common electrode 4 is formed; and a piezoelectric layer 7 in which terminal electrodes 17, 18 are formed, as an uppermost layer laid on the stack.

Each piezoelectric layer 3, 5, 7 consists primarily of a ceramic material such as lead zirconate titanate and is formed, for example, in a rectangular thin plate shape of "10 mm×30 mm and 30 µm thick." The individual electrodes 2 and common electrodes 4 are made of a material consisting primarily of silver and palladium, and are formed in a pattern by screen printing. This also applies similarly to each of electrodes described below, except for the terminal electrodes 17, 18.

Figure 2:
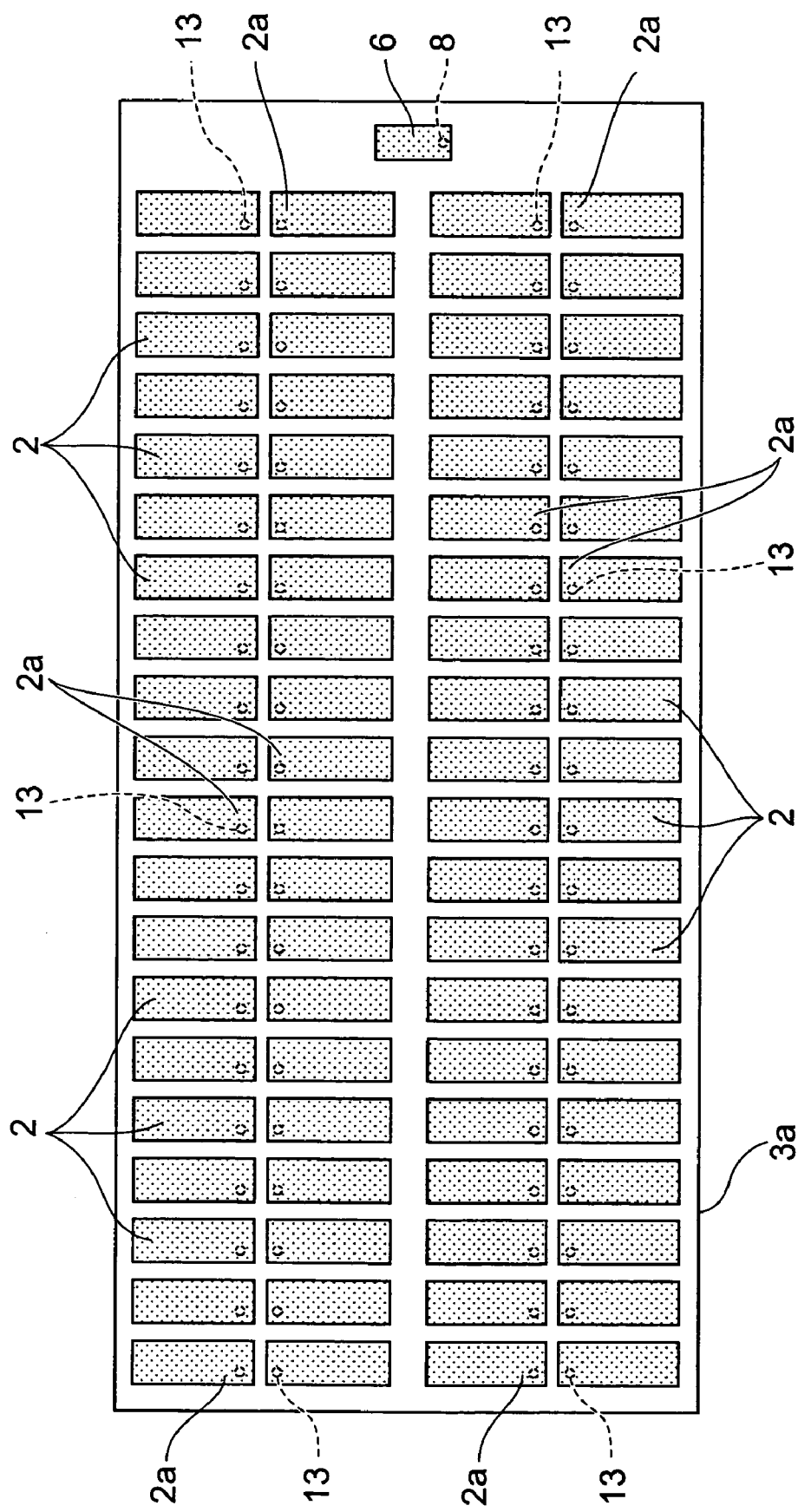
FIG. 2 is a plan view of the second, fourth, sixth, and eighth piezoelectric layers in the stack-type piezoelectric device shown in FIG. 1.

A number of rectangular individual electrodes 2 are arranged in a matrix, as shown in FIG. 2, on the upper surfaces of the second, fourth, sixth, and eighth piezoelectric layers 3a as counted from the uppermost piezoelectric layer 7. Each individual electrode 2 is placed so that the longitudinal direction thereof is perpendicular to the longitudinal direction of the piezoelectric layer 3a, and adjacent individual electrodes 2, 2 are placed with a predetermined space to achieve electrical independence of each other and to prevent influence of each other's vibrations.

Let the longitudinal direction of the piezoelectric layers 3a be a row direction and the direction perpendicular to the longitudinal direction be a column direction. Then the individual electrodes 2 are arranged, for example, in a matrix of four rows and seventy five columns (the drawing shows a matrix of four rows and twenty columns for clarity).

This matrix arrangement of many individual electrodes 2 enables efficient arrangement for the piezoelectric layers 3a, and it is thus feasible to achieve miniaturization of the stack-type piezoelectric device 1 or high integration of individual electrodes 2, while maintaining the area of active parts contributing to vibration in the piezoelectric layers 3a.

The individual electrodes 2 in the first row and in the second row have their respective ends opposed between the first row and the second row, as connection ends 2a, and are connected to respective electroconductive members in through holes 13 formed immediately below the connection ends 2a in the piezoelectric layer 3a. Similarly, the individual electrodes 2 in the third row and in the fourth row have their respective ends opposed between the third row and the fourth row, as connection ends 2a, and are connected to respective electroconductive members in through holes 13 formed immediately below the connection ends 2a in the piezoelectric layer 3a.

Furthermore, a relay electrode 6 for electrical connection between common electrodes 4, 4 of the piezoelectric layers 5 located up and down is formed in an edge region on the upper surface of each piezoelectric layer 3a. This relay electrode 6 is connected to an electroconductive member in a through hole 8 formed immediately below it in the piezoelectric layer 3a.

Figure 3:
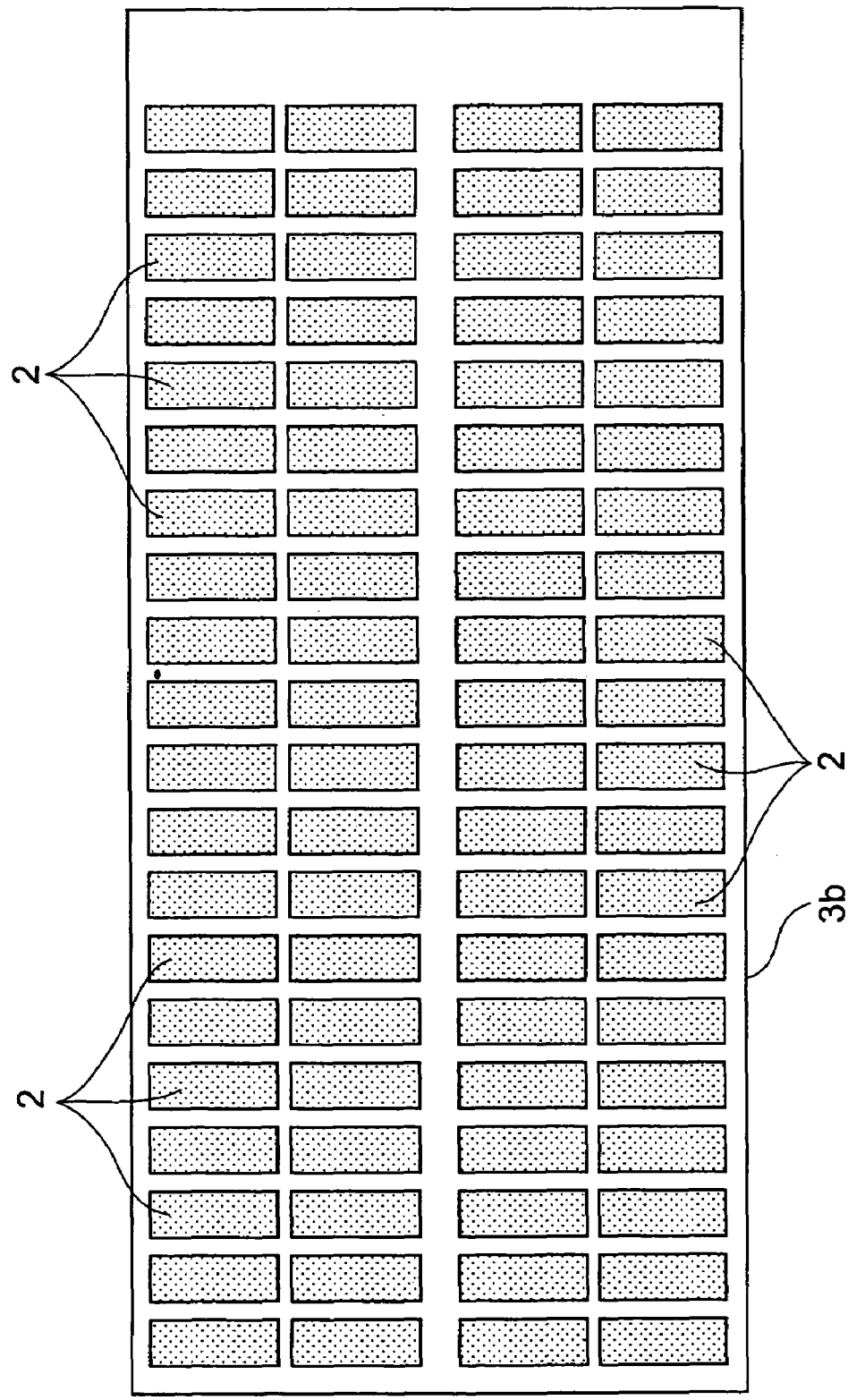
FIG. 3 is a plan view of the lowermost piezoelectric layer in the stack-type piezoelectric device shown in FIG. 1.

Individual electrodes 2 are also arranged in a matrix on the upper surface of the lowermost piezoelectric layer 3b, as in the second, fourth, sixth, and eighth piezoelectric layers 3a described above. However, the lowermost piezoelectric layer 3b is different from the piezoelectric layers 3a in that the relay electrode 6 and the through holes 8, 13 are not formed, as shown in FIG. 3.

Figure 4:
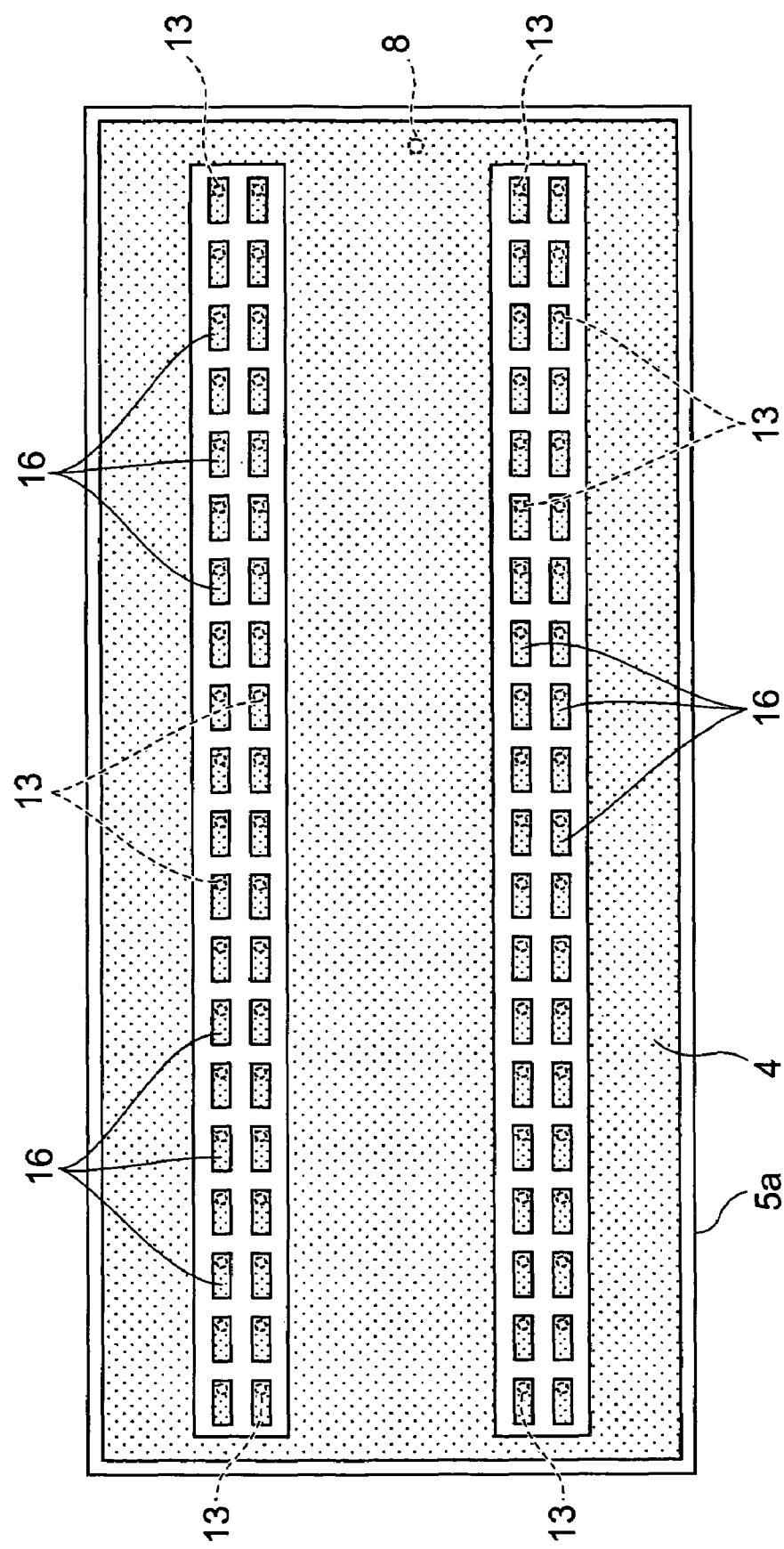
FIG. 4 is a plan view of the third, fifth, and seventh piezoelectric layers in the stack-type piezoelectric device shown in FIG. 1.

As shown in FIG. 4, relay electrodes 16 are formed so as to face the respective connection ends 2a of the piezoelectric layers 3a in the stack direction of the stack-type piezoelectric device 1 (in other words, the thickness direction of stack-type piezoelectric device 1, i.e., thickness direction of piezoelectric layers 3, 5), on the upper surfaces of the third, fifth, and seventh piezoelectric layers 5a as counted from the uppermost piezoelectric layer 7. Each relay electrode 16 is connected to an electroconductive member in a through hole 13 formed immediately below the relay electrode in the piezoelectric layer 5.

Furthermore, a common electrode 4 is formed on the upper surface of each piezoelectric layer 5a. This common electrode 4 surrounds each of a group of relay electrodes 16 in the first row and in the second row and a group of relay electrodes 16 in the third row and in the fourth row, with a predetermined space, and overlaps portions except for the connection ends 2a of the respective individual electrodes 2, when viewed from the stack direction. This permits the whole of portions facing the portions except for the connection ends 2a of the respective individual electrodes 2 in the piezoelectric layers 3, 5 to be effectively used as active parts contributing to vibration. The common electrode 4 is formed with a predetermined space from the peripheral part of each piezoelectric layer 5a, and is connected to an electroconductive member in a through hole 8 formed in the piezoelectric layer 5 so as to face the relay electrode 6 of the piezoelectric layer 3a in the stack direction.

Figure 5:
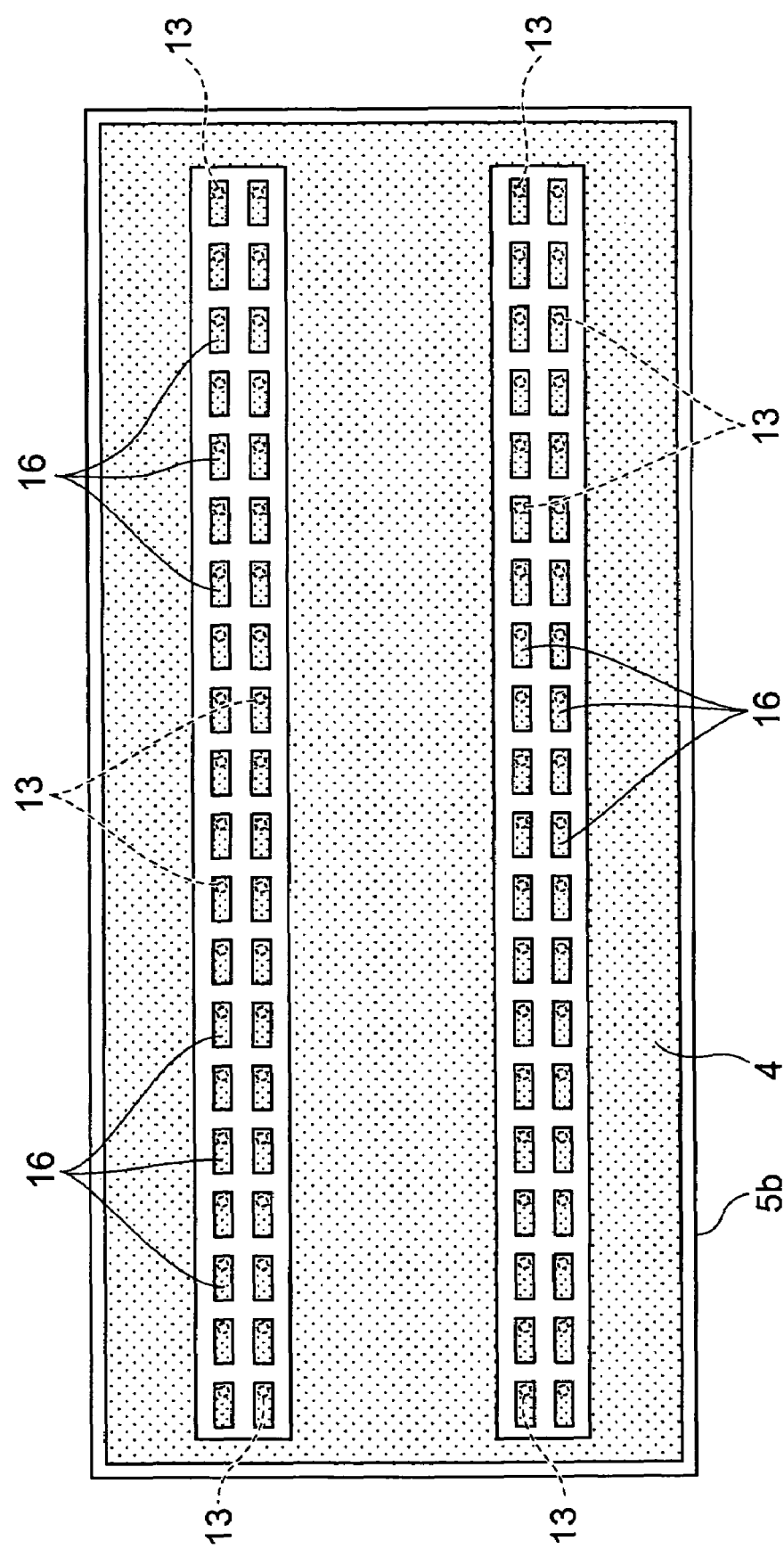
FIG. 5 is a plan view of the ninth piezoelectric layer in the stack-type piezoelectric device shown in FIG. 1.

Relay electrodes 16 and common electrode 4 are also formed on the upper surface of the ninth piezoelectric layer 5b, as in the case of the aforementioned third, fifth, and seventh piezoelectric layers 5a. However, as shown in FIG. 5, the ninth piezoelectric layer 5b is different from the piezoelectric layers 5a in that no through hole 8 is formed.

Figure 6:
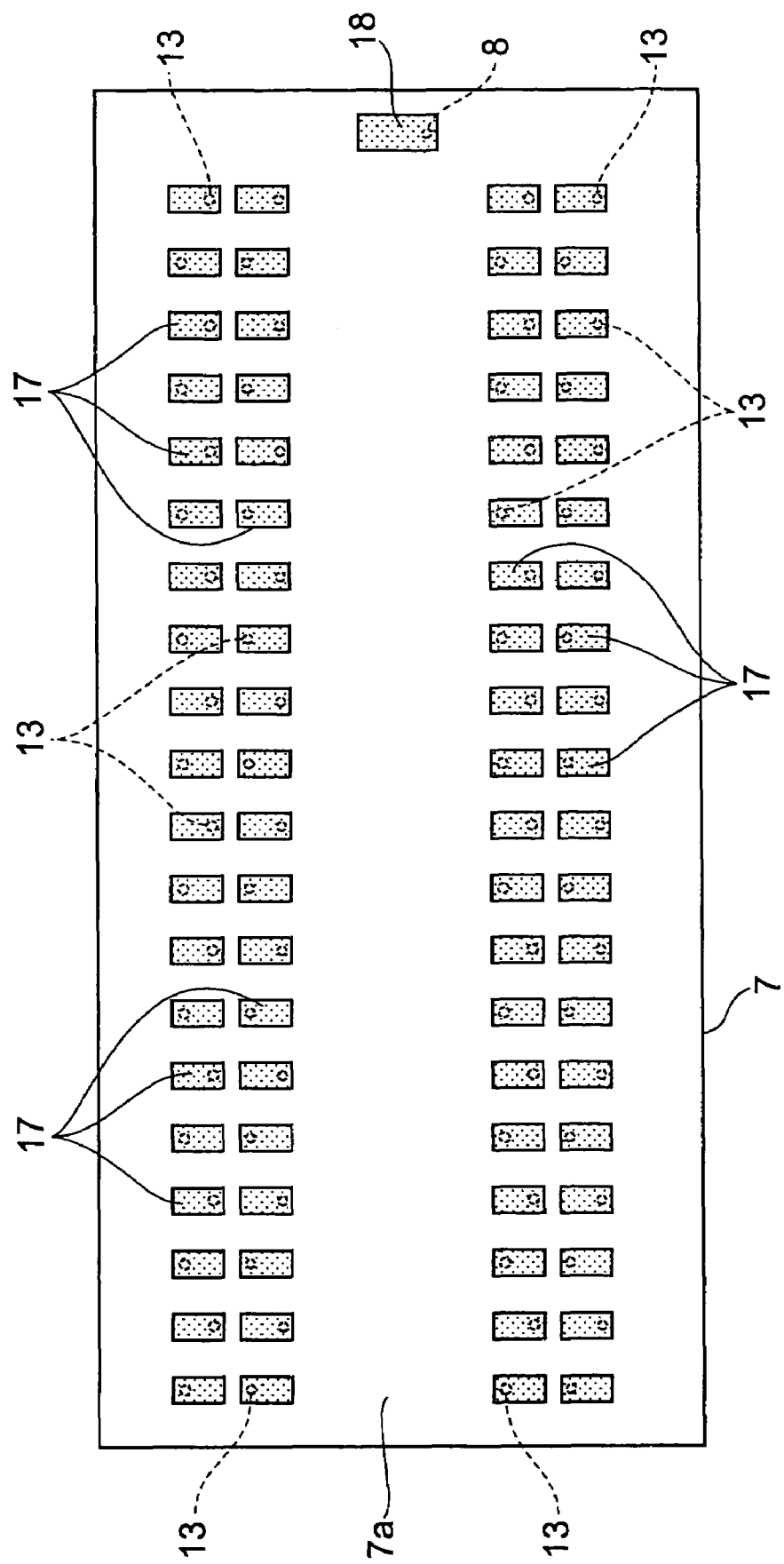
FIG. 6 is a plan view of the uppermost piezoelectric layer in the stack-type piezoelectric device shown in FIG. 1.

As shown in FIG. 6, terminal electrodes 17 are formed so as to face the connection ends 2a of the corresponding individual electrodes 2 of the piezoelectric layers 3a in the stack direction, on the upper surface of the uppermost piezoelectric layer 7, and a terminal electrode 18 is formed so as to face the relay electrodes 6 of the piezoelectric layers 3a in the stack direction. Each terminal electrode 17 is connected to an electroconductive member in a through hole 13 formed immediately below it in the piezoelectric layer 7, and the terminal electrode 18 is connected to an electroconductive member in a through hole 8 formed immediately below it in the piezoelectric layer 7. Lead wires for connection to a drive power supply are soldered to these terminal electrodes 17, 18.

Figure 7:
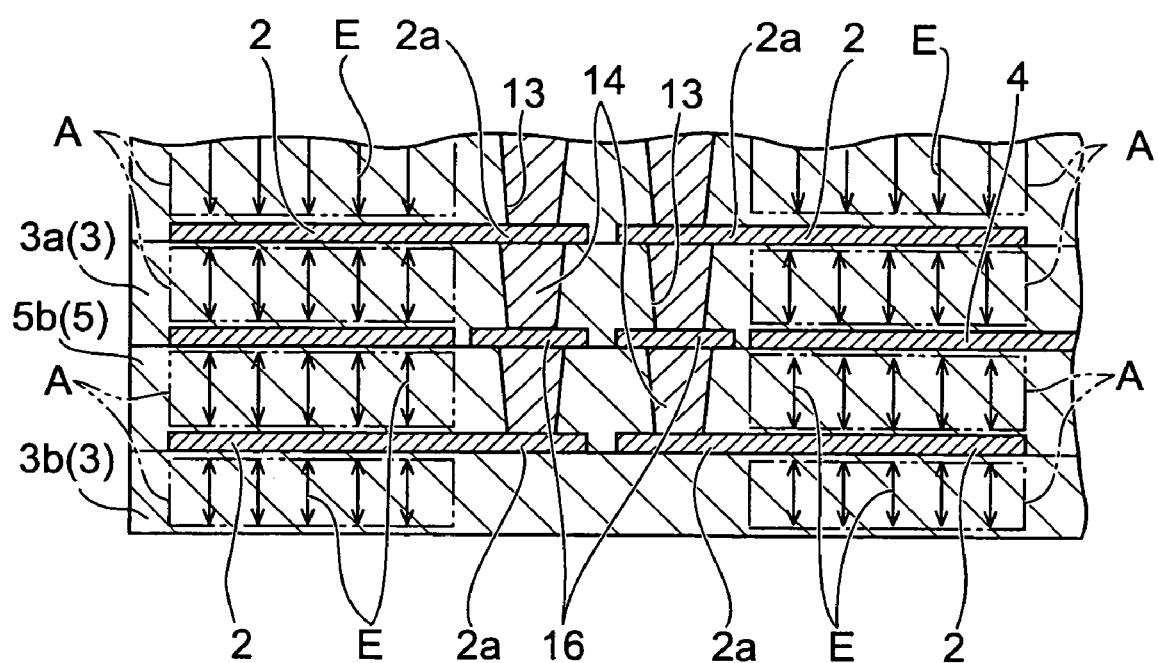
FIG. 7 is an enlarged partial sectional view along the direction normal to the longitudinal direction of the stack-type piezoelectric device shown in FIG. 1.

By the stack of piezoelectric layers 3, 5, and 7 with the electrode patterns formed as described above, five individual electrodes 2 are aligned in the stack direction through the intervention of the relay electrodes 16 with each terminal electrode 17 of the uppermost layer, and the electrodes 2, 16, and 17 thus aligned are electrically connected by the electroconductive members 14 in the through holes 13, as shown in FIG. 7. On the other hand, four common electrodes 4 are aligned in the stack direction through the intervention of the relay electrodes 6 with the terminal electrode 18 of the uppermost layer, and the electrodes 4, 6, 18 thus aligned are electrically connected by the electroconductive members 14 in the through holes 8.

With this electrical connection in the stack-type piezoelectric device 1, when a voltage is applied between predetermined terminal electrode 17 and terminal electrode 18, the voltage is applied between the individual electrodes 2 aligned under the predetermined terminal electrode 17, and common electrodes 4. This results in establishing electric fields E in the portions between the individual electrodes 2 and common electrodes 4, as shown in FIG. 7, in the piezoelectric layers 3, 5, whereby these portions are displaced as active parts A. By selecting a terminal electrode 17 to which a voltage is to be applied, therefore, it is feasible to displace the active parts A aligned under the selected terminal electrode 17, in the stack direction, among the active parts A corresponding to the respective individual electrodes 2 arranged in the matrix. The stack-type piezoelectric device 1 is applied to the drive source of various devices involving small displacement, such as control of a valve of a micropump.

Next, the aforementioned terminal electrodes 17 will be described below in more detail. Under such definitions that the longitudinal direction of the piezoelectric layer (substrate) 7 is the row direction and that the direction perpendicular to the longitudinal direction is the column direction, as shown in FIG. 6, the terminal electrodes 17 are arranged, for example, in a matrix of four rows and seventy five columns on the surface 7a of the piezoelectric layer 7 (four rows and twenty columns in the drawing for clarity) so as to face the connection ends 2a of the respective individual electrodes 2 in the piezoelectric layers 3a in the stack direction. Each terminal electrode 17 is formed in a rectangular shape and is placed so that its longitudinal direction agrees with the column direction.

Through holes 13 formed immediately below the respective terminal electrodes 17 arrayed along the row direction on the surface 7a of the piezoelectric layer 7 are arranged in a stagger pattern in the row direction. Therefore, as shown in FIG. 8, in each row of the first row to the fourth row, one terminal electrode 17 out of two terminal electrodes 17, 17 adjacent in the row direction is connected to an electroconductive member 14 in a through hole 13 on one end side in the longitudinal direction of the terminal electrode, while the other terminal electrode 17 is connected to an electroconductive member 14 in a through hole 13 on the other end side in the longitudinal direction thereof.

Figure 8:
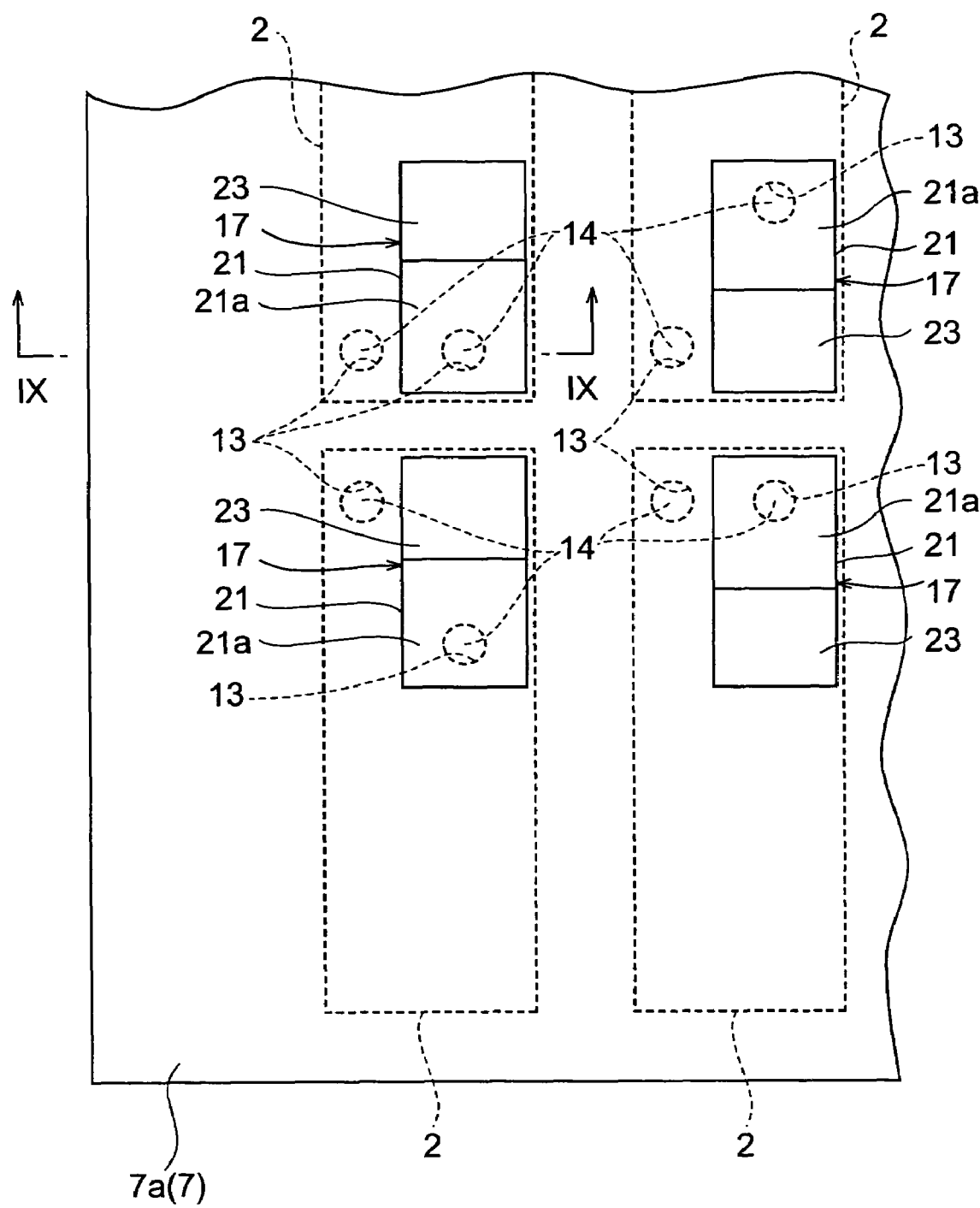
FIG. 8 is an enlarged partial plan view of the stack-type piezoelectric device shown in FIG. 1.
Figure 9:
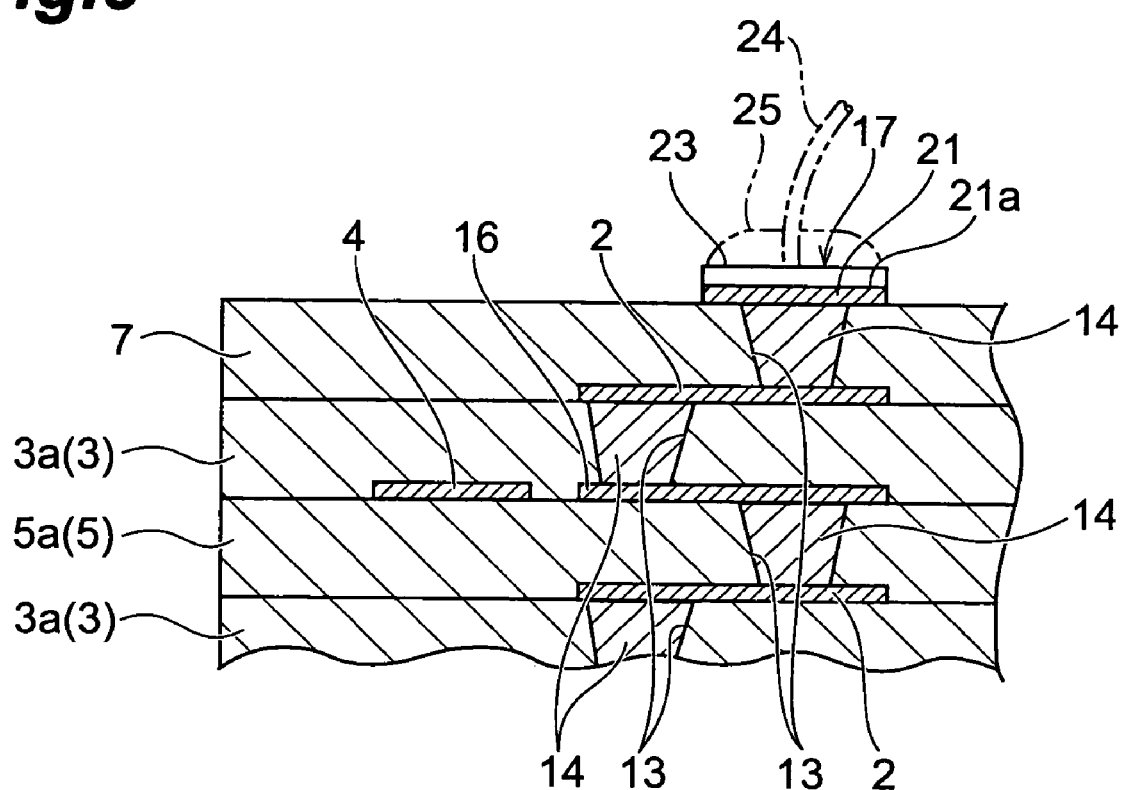
FIG. 9 is an enlarged partial sectional view along IX-IX line shown in FIG. 8.

As shown in FIGS. 8 and 9, each terminal electrode 17 has a first electrode layer 21 formed on the surface 7a of the piezoelectric layer 7 so as to cover an opening of a through hole 13, and a second electrode layer 23 formed on a surface 21a of this first electrode layer 21. This second electrode layer 23 is a portion where a lead wire 24 is to be connected by a solder 25, and is formed on the side opposite to the side where the first electrode layer 21 is connected to the electroconductive member 14 in the through hole 13. The first electrode layer 21 is made of a material consisting primarily of silver and palladium, and the second electrode layer 23 of a material consisting primarily of silver.

In the stack-type piezoelectric device 1 of the first embodiment, as described above, for one terminal electrode 17 out of two adjacent terminal electrodes 17, 17, a lead wire 24 is soldered to the second electrode layer 23 formed on one end side in the longitudinal direction thereof, while for the other terminal electrode 17 a lead wire 24 is soldered to the second electrode layer 23 formed on the other end side in the longitudinal direction thereof. Since the one end side of one terminal electrode 17 and the other end side of the other terminal electrode 17 are located on the side opposite to the side where each terminal electrode is connected to the electroconductive member 14 in the through hole 13, it becomes feasible to prevent the electroconductive member 14 in the through hole 13 from dissolving into a molten solder 25 during soldering of the lead wire 24 to the second electrode layer 23 of each terminal electrode 17. In addition, the soldering of lead wires 24 as described above can prevent solders 25 from adjoining in the direction perpendicular to the longitudinal direction of terminal electrodes 17. For this reason, it becomes feasible to prevent solders 25 from joining together between adjacent terminal electrodes 17, 17. Therefore, the stack-type piezoelectric device 1 of the first embodiment permits the lead wires 24 to be securely soldered to the respective terminal electrodes 17 connected to the electroconductive members 14 in the through holes 13.

The terminal electrodes 17 are formed in a rectangular shape whose longitudinal direction is the column direction perpendicular to the arrangement direction thereof (i.e., the row direction). This secures a long distance between the portion of each terminal electrode 17 connected to the electroconductive member 14 in the through hole 13, and the second electrode layer 23 to which the lead wire 24 is to be soldered, whereby the electroconductive member 14 in the through hole 13 is more securely prevented from dissolving into the molten solder 25. Furthermore, even if adjacent terminal electrodes 17, 17 are formed with a narrower space, the distance can be kept long between second electrode layers 23, 23 to which respective lead wires 24 are to be soldered in the corresponding terminal electrodes 17, 17 adjacent to each other, and it is thus feasible to more securely prevent solders 25 from joining together between the adjacent terminal electrodes 17, 17.

The second electrode layer 23 being the part to which a lead wire 24 is to be connected by a solder 25 is made of the material consisting primarily of silver, which is a material on which the solder can be readily placed. For this reason, the lead wire 24 can be securely soldered to the second electrode layer 23 formed on the side opposite to the side where the first electrode layer is connected to the electroconductive member 14 in the through hole 13.

Next, a production procedure of the stack-type piezoelectric device 1 will be described. First, a substrate paste is prepared by mixing an organic binder, an organic solvent, etc. into a piezoelectric ceramic material consisting primarily of lead zirconate titanate or the like, and green sheets for the respective piezoelectric layers 3, 5, 7 are formed using the substrate paste. An electroconductive paste is also prepared by mixing an organic binder, an organic solvent, etc. into a metal material consisting of silver and palladium in a predetermined proportion.

Subsequently, laser light is applied to predetermined positions on the green sheets for the respective piezoelectric layers 3, 5, 7 to form the through holes 8, 13. Then filling screen print with the electroconductive paste is carried out into the through holes 8, 13 to form the electroconductive members 14. Thereafter, screen print with the electroconductive paste is carried out on the green sheets for the respective piezoelectric layers 3, 5 to form the electrodes 2, 4, 6, 16. Screen print with the electroconductive paste is also carried out on the green sheet for the uppermost piezoelectric layer 7 to form the first electrode layers 21 as ground electrodes.

Subsequently, the green sheets with the electrode patterns thereon are stacked in the aforementioned order and are pressed in the stack direction to fabricate a green laminate. This green laminate is degreased and baked, and thereafter, baked electrodes of silver are placed on the sintered sheet for the piezoelectric layer 7 to form the second electrode layers 23. Thereafter, a polarization process is carried out to complete the stack-type piezoelectric device 1. Gold, copper, or the like may also be used as the material of the second electrode layers 23. The second electrode layers 23 may also be formed by another method such as sputtering, electroless plating, or the like.

Second Embodiment

Figure 10:
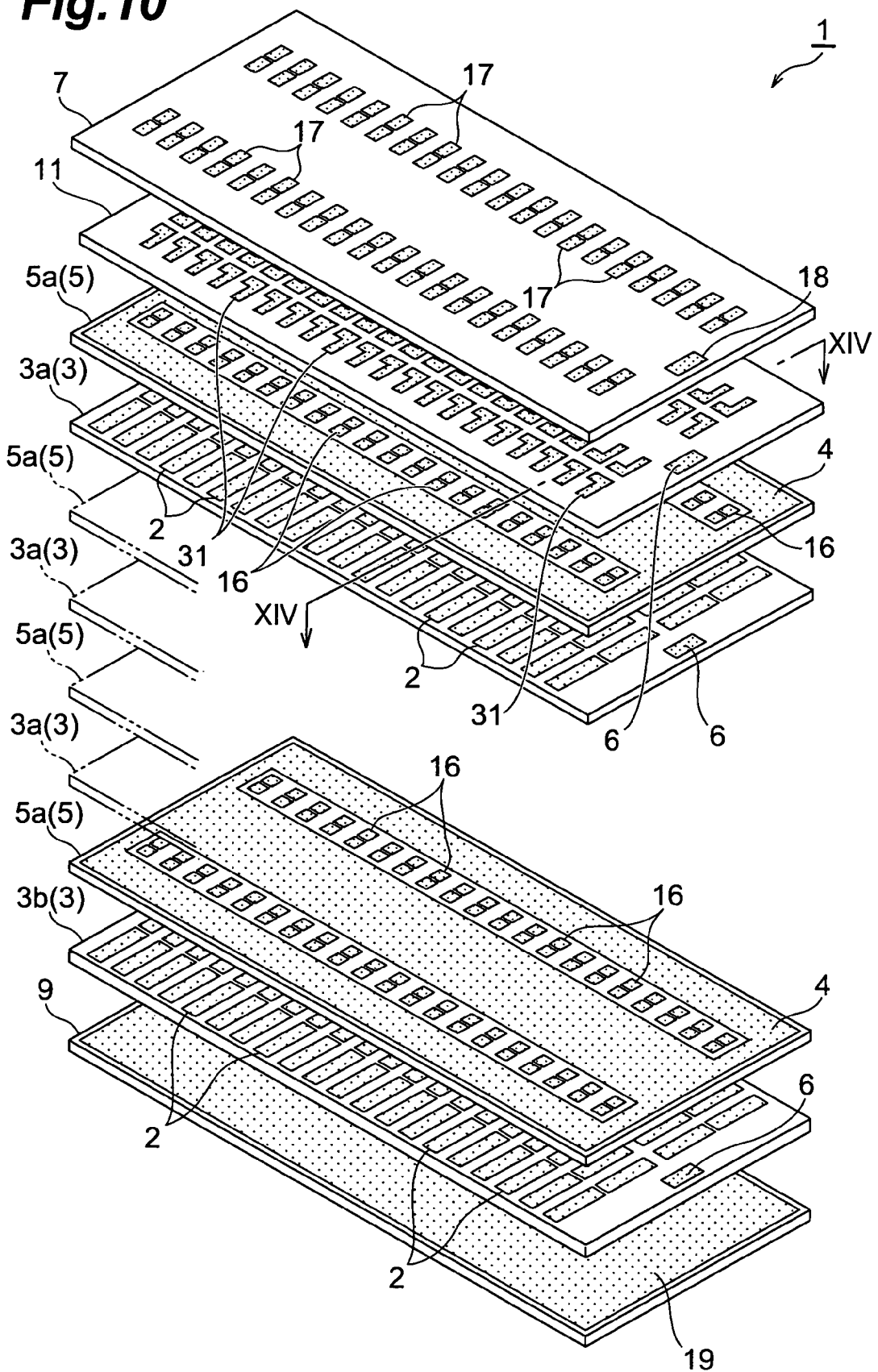
FIG. 10 is an exploded perspective view showing a stack-type piezoelectric device of a second embodiment.

As shown in FIG. 10, the stack-type piezoelectric device 1 of the second embodiment is comprised of an alternate stack of piezoelectric layers 3 in each of which individual electrodes 2 are formed, and piezoelectric layers 5 in each of which a common electrode 4 is formed; a piezoelectric layer 11 in which relay electrodes 6, 31 are formed; and a piezoelectric layer 7 in which terminal electrodes 17, 18 are formed, while these piezoelectric layers are stacked in order on a piezoelectric layer 9 as a base. The stack-type piezoelectric device 1 of the second embodiment will be described below with focus on differences from the stack-type piezoelectric device 1 of the first embodiment.

The piezoelectric layer 7 shown in FIG. 6 is laid as the uppermost layer and the piezoelectric layers 3a shown in FIG. 2 are laid as the fourth, sixth, and eighth layers as counted from the uppermost piezoelectric layer 7. The tenth piezoelectric layer 3b is different from the piezoelectric layers 3a in that the tenth piezoelectric layer 3b is formed without the through holes 8, 13.

Figure 11:
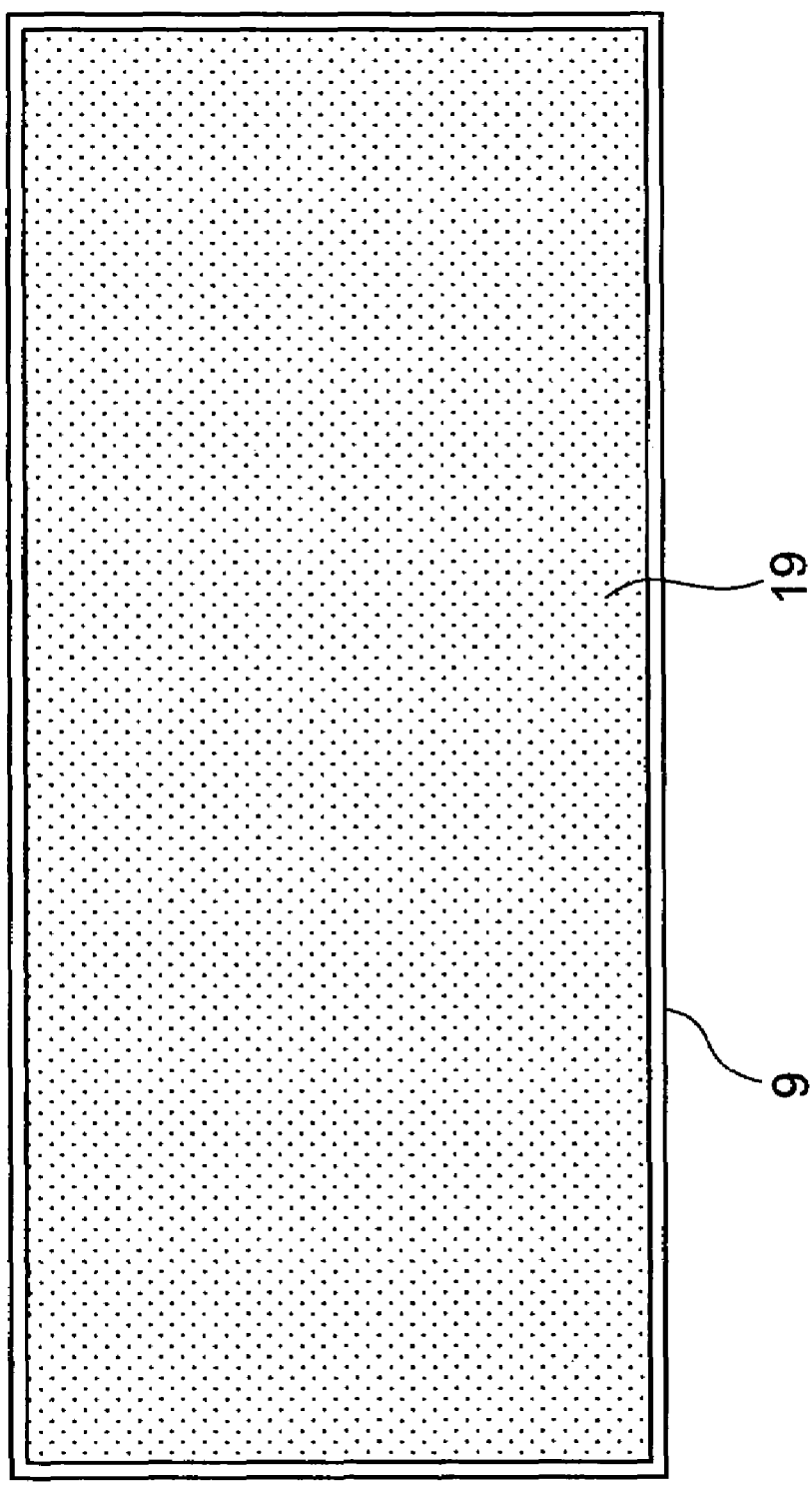
FIG. 11 is a plan view of the lowermost piezoelectric layer in the stack-type piezoelectric device shown in FIG. 10.

The piezoelectric layers 5a shown in FIG. 4 are laid as the third, fifth, seventh, and ninth layers as counted from the uppermost piezoelectric layer 7. A rectangular common electrode 19 having the contour equivalent to that of the common electrode 4 of the piezoelectric layers 5a is formed, as shown in FIG. 11, on the upper surface of the lowermost piezoelectric layer 9.

Figure 12:
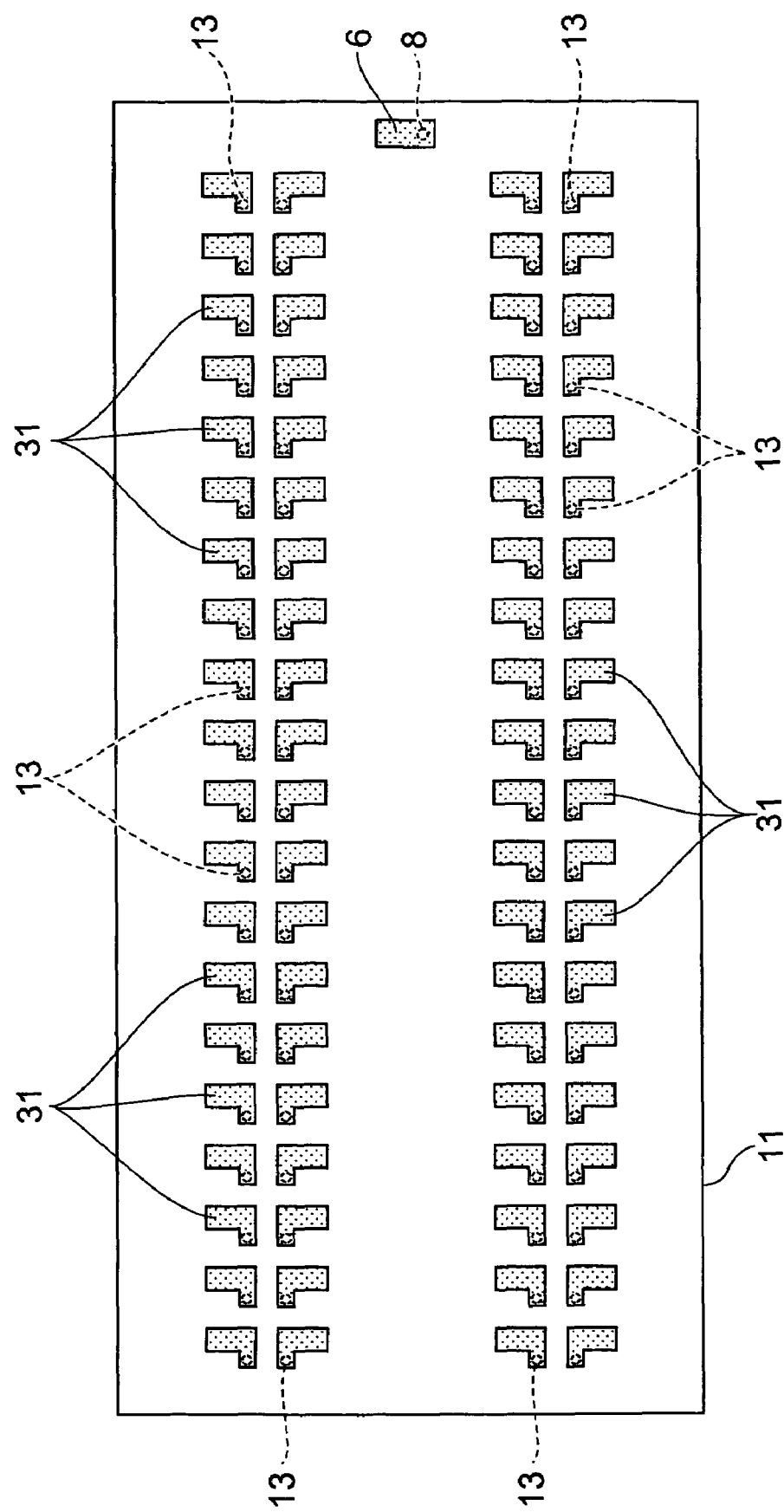
FIG. 12 is a plan view of the second piezoelectric layer in the stack-type piezoelectric device shown in FIG. 10.

Furthermore, relay electrodes 31 are formed so as to face the terminal electrodes 17 of the piezoelectric layer 7 in the stack direction and so as to face the relay electrodes 16 of the piezoelectric layer 5a, as shown in FIG. 12, on the upper surface of the second piezoelectric layer 11 as counted from the uppermost piezoelectric layer 7, and a relay electrode 6 is formed so as to face the terminal electrode 18 of the piezoelectric layer 7 in the stack direction. Each relay electrode 31 is connected to an electroconductive member in a through hole 13 formed immediately below it in the piezoelectric layer 11, and the relay electrode 6 is connected to an electroconductive member in a through hole 8 formed immediately below it in the piezoelectric layer 11.

Figure 13:
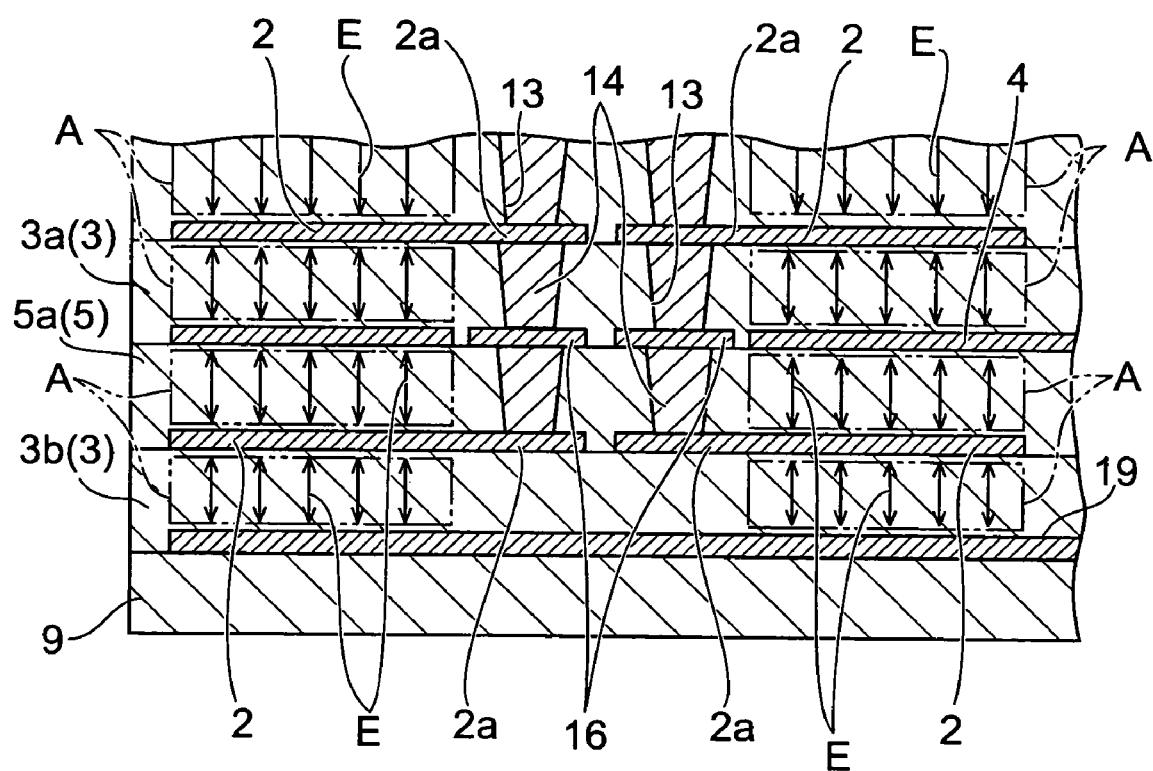
FIG. 13 is an enlarged partial sectional view along the direction normal to the longitudinal direction of the stack-type piezoelectric device shown in FIG. 10.

As the piezoelectric layers 3, 5, 7, 9, and 11 with the electrode patterns formed therein are stacked as described above, four individual electrodes 2 are aligned in the stack direction through the intervention of the relay electrodes 16, 31 with each terminal electrode 17 of the uppermost layer, and the electrodes 2, 6, 16, 31 thus aligned are electrically connected by the electroconductive members 14 in the through holes 13, as shown in FIG. 13. On the other hand, four common electrodes 4 and the common electrode 19 of the lowermost layer are aligned in the stack direction through the intervention of the relay electrodes 6 with the terminal electrode 18 of the uppermost layer, and the electrodes 4, 6, 18, 19 thus aligned are electrically connected by the electroconductive members 14 in the through holes 8.

With the electrical connection in the stack-type piezoelectric device 1 as described above, when a voltage is applied between a predetermined terminal electrode 17 and the terminal electrode 18, the voltage is applied between the individual electrodes 2 aligned under the predetermined terminal electrode 17, and the common electrodes 4. This results in establishing electric fields E in portions between the individual electrodes 2 and the common electrodes 4, as shown in FIG. 13, in the piezoelectric layers 3, 5, and the portions as displaced as active parts A. By selecting a terminal electrode 17 to which the voltage is to be applied, it is thus feasible to displace the active parts A aligned under the selected terminal electrode 17, in the stack direction, out of the active parts A corresponding to the respective individual electrodes 2 arranged in the matrix. The stack-type piezoelectric device 1 of this configuration is applied to a drive source of various devices requiring small displacement, such as control of a valve of a micropump, as the stack-type piezoelectric device 1 of the first embodiment is.

Figure 14:
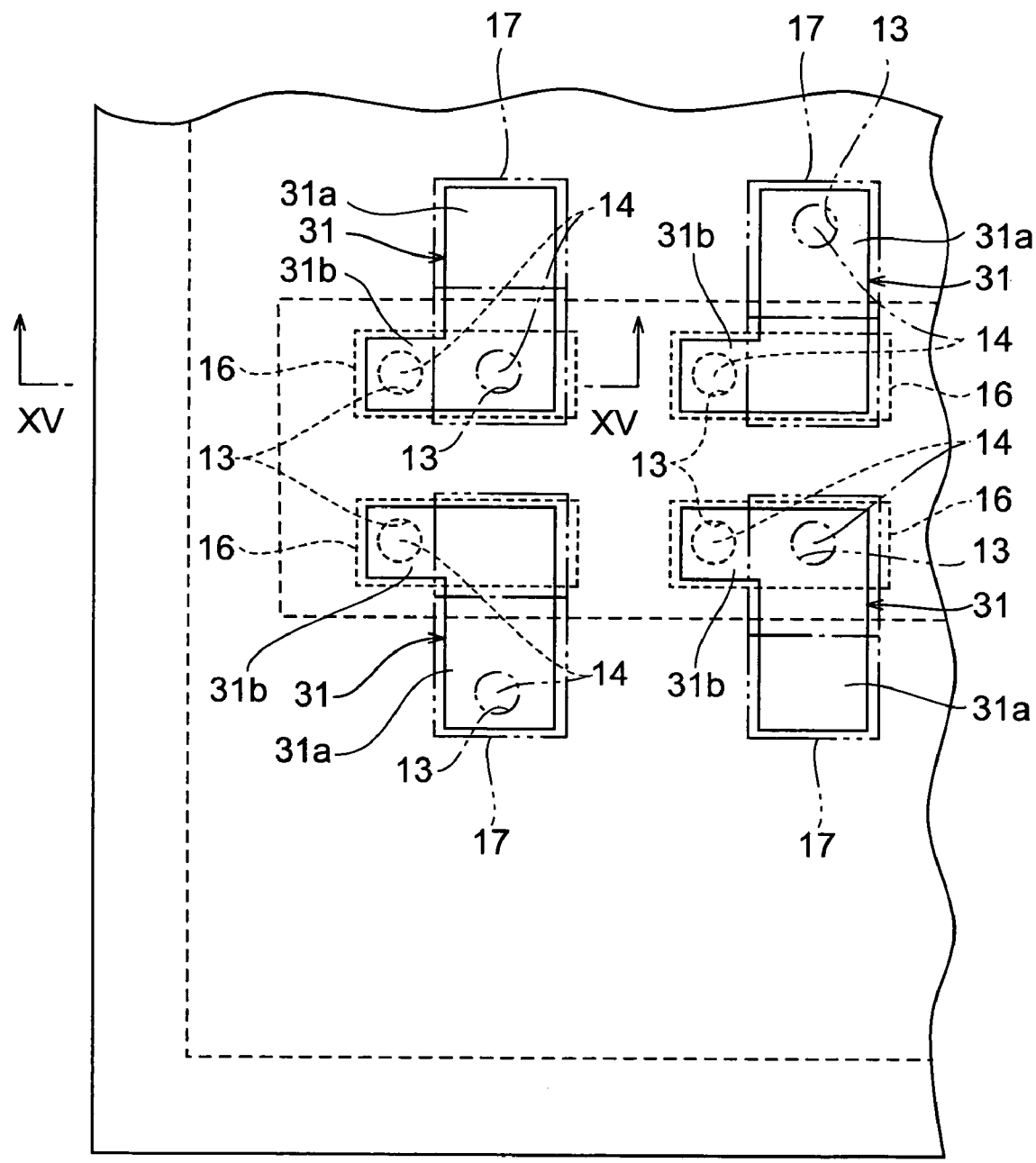
FIG. 14 is an enlarged partial sectional view along XIV-XIV line shown in FIG. 10.
Figure 15:
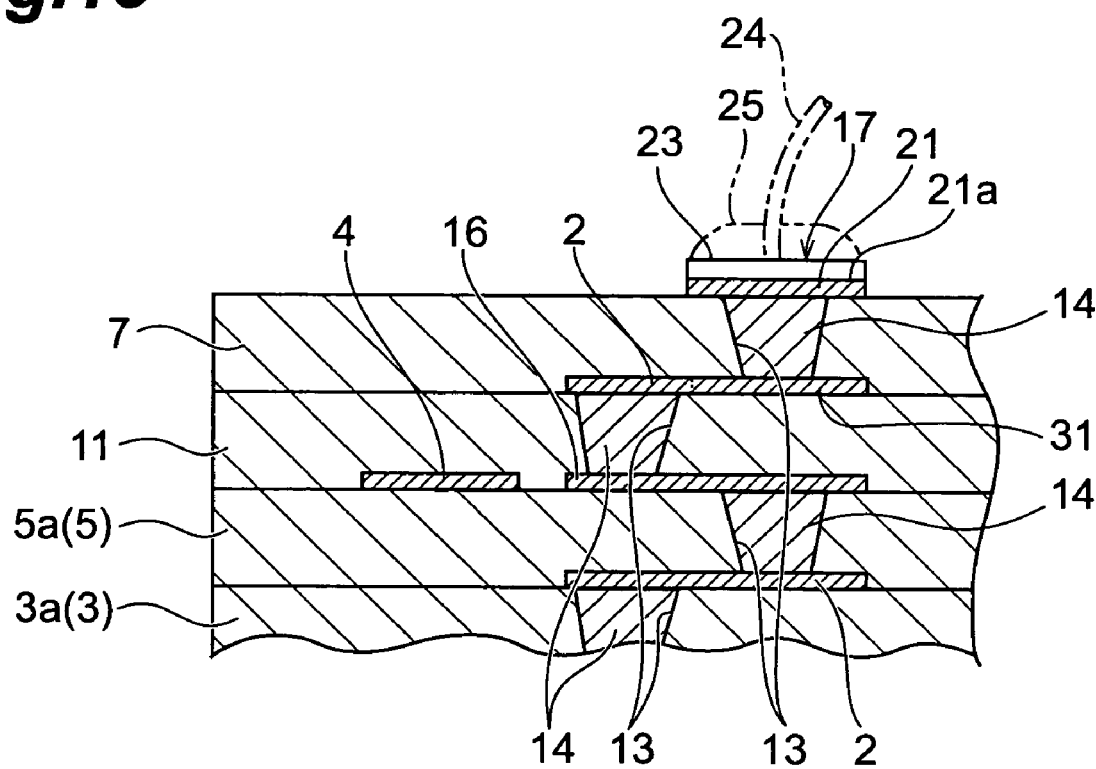
FIG. 15 is an enlarged partial sectional view along XV-XV line shown in FIG. 14.

The above-described relay electrodes 31 will be described below in more detail. As shown in FIG. 14, each relay electrode 31 is formed in an L-shape on the surface 11a of the piezoelectric layer 11. In each relay electrode 31, a first portion 31a extending along the direction perpendicular to the longitudinal direction of the piezoelectric layer 11 faces a terminal electrode 17 of the piezoelectric layer 7 located immediately above in the stack direction, and a second portion 31b extending along the longitudinal direction of the piezoelectric layer 11 faces a relay electrode 16 of the piezoelectric layer 5a located immediately below in the stack direction.

The relay electrode 31 formed in this configuration is connected to the relay electrode 16 of the piezoelectric layer 5a by the electroconductive member 14 through the through hole 13 formed immediately below the distal part of the second portion 31b (the projecting part from the first portion 31a) in the piezoelectric layer 11. The first portion 31a of the relay electrode 31 is connected to the terminal electrode 17 by the electroconductive member 14 through the through hole 13 formed in the piezoelectric layer 7 immediately below the terminal electrode 17.

In this case, the terminal electrode 17 and the first portion 31a of the relay electrode 31 are shaped so as to approximately overlap with each other when viewed from the stack direction. For this reason, even in the configuration wherein the through hole 13 formed in the piezoelectric layer 7 in order to connect the terminal electrode 17 and the relay electrode 31 is formed immediately below either the one end side or the other end side of the terminal electrode 17, the terminal electrode 17 and the relay electrode 31 can be securely connected by the electroconductive member 14 and, in turn, the terminal electrode 17 and the relay electrode 16 can be electrically securely connected.

The present invention is not limited to the above-described first and second embodiments. For example, each of the above embodiments was directed to the case where the terminal electrodes 17 were formed in the rectangular shape whose longitudinal direction was the column direction perpendicular to the arrangement direction thereof (i.e., the row direction), but the terminal electrodes 17 may be formed in any other shape, such as an elliptic shape or a square shape.

Each of the above embodiments was directed to the case where the terminal electrodes 17 were of the double-layer structure having the first electrode layer 21 and the second electrode layer 23, but the terminal electrodes 17 may be, for example, of a single-layer structure without the second electrode layer 23 if the first electrode layer 21 can be made of a material on which a solder can be readily placed.

Furthermore, the present invention is also applicable to a variety of electronic components using through holes for electrical connection, besides the stack-type piezoelectric devices 1.

The present invention permits lead wires or the like to be securely soldered to the respective terminal electrodes connected to the electroconductive members in the through holes.

What is claimed is:

1. An electronic component in which each of a plurality of terminal electrodes arranged along a predetermined direction on a surface of a substrate is connected to an electroconductive member in a through hole formed in the substrate,
wherein one of two terminal electrodes adjacent to each other along the predetermined direction is connected to the electroconductive member in the through hole on one end side in a direction perpendicular to the predetermined direction and wherein the other terminal electrode is connected to the electroconductive member in the through hole on the other end side in the direction perpendicular to the predetermined direction.

2. The electronic component according to claim 1, wherein the terminal electrodes are formed in a shape whose longitudinal direction is the direction perpendicular to the predetermined direction.

3. The electronic component according to claim 1, wherein each terminal electrode comprises a first electrode layer formed on the surface of the substrate, and a second electrode layer formed on a surface of the first electrode layer, and
wherein the second electrode layer is formed on a side opposite to a side where the first electrode layer is connected to the electroconductive member in the through hole.

4. The electronic component according to claim 1, wherein a lead wire is connected to each terminal electrode by a solder.

* * * * *